United States Patent
Gillotti et al.

(10) Patent No.: US 8,313,015 B2
(45) Date of Patent: Nov. 20, 2012

(54) GAS DELIVERY SYSTEM FOR REDUCING OXIDATION IN WIRE BONDING OPERATIONS

(75) Inventors: Gary S. Gillotti, Lansdale, PA (US); Stanley Szczesniak, Warrington, PA (US); Peter J. Van Emmerik, Center Valley, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 13/272,664

(22) Filed: Oct. 13, 2011

(65) Prior Publication Data

US 2012/0031877 A1 Feb. 9, 2012

Related U.S. Application Data

(63) Continuation of application No. 12/739,100, filed as application No. PCT/US2009/046535 on Jun. 8, 2009, now Pat. No. 8,066,170.

(60) Provisional application No. 61/060,189, filed on Jun. 10, 2008.

(51) Int. Cl.
- *B23K 1/06* (2006.01)
- *B23K 35/00* (2006.01)
- *B23K 37/00* (2006.01)

(52) U.S. Cl. ..... 228/4.5; 228/180.5; 228/904; 219/56.1; 219/85.18

(58) Field of Classification Search .................. 228/4.5, 228/180.5, 904; 219/56.1, 85.18
See application file for complete search history.

(56) References Cited

U.S. PATENT DOCUMENTS

| | | | |
|---|---|---|---|
| 4,572,772 A | 2/1986 | Peterson | |
| 5,265,788 A | 11/1993 | Ozawa et al. | |
| 5,395,037 A | 3/1995 | Takahashi et al. | |
| 5,616,257 A * | 4/1997 | Harada et al. | 219/56.21 |
| 6,180,891 B1 * | 1/2001 | Murdeshwar | 174/260 |
| 6,234,376 B1 | 5/2001 | Wicen | |
| 6,267,290 B1 | 7/2001 | Murdeshwar | |
| 6,866,182 B2 | 3/2005 | Wong et al. | |
| 7,103,959 B2 * | 9/2006 | Yeap et al. | 29/564 |
| 7,182,793 B2 | 2/2007 | Duan et al. | |
| 7,578,423 B1 | 8/2009 | Duan et al. | |
| 7,628,307 B2 * | 12/2009 | Wong et al. | 228/4.5 |

(Continued)

FOREIGN PATENT DOCUMENTS

JP 59-150437 8/1984

(Continued)

OTHER PUBLICATIONS

International Search Report Dated Jan. 14, 2010, International Application No. PCT/US2009/046535.

*Primary Examiner* — Devang R Patel
(74) *Attorney, Agent, or Firm* — Christopher M. Spletzer, Sr.

(57) ABSTRACT

A wire bonding machine is provided. The wire bonding machine includes a bonding tool and an electrode for forming a free air ball on an end of a wire extending through the bonding tool where the free air ball is formed at a free air ball formation area of the wire bonding machine. The wire bonding machine also includes a bond site area for holding a semiconductor device during a wire bonding operation. The wire bonding machine also includes a gas delivery mechanism configured to provide a cover gas to: (1) the bond site area whereby the cover gas is ejected through at least one aperture of the gas delivery mechanism to the bond site area, and (2) the free air ball formation area.

19 Claims, 13 Drawing Sheets

U.S. PATENT DOCUMENTS

| | | |
|---|---|---|
| 7,658,313 B2 | 2/2010 | Nishiura et al. |
| 2003/0173659 A1 | 9/2003 | Lee et al. |
| 2007/0251980 A1 | 11/2007 | Gillotti et al. |
| 2007/0284421 A1 | 12/2007 | Gillotti et al. |
| 2008/0099531 A1 | 5/2008 | Wong et al. |

FOREIGN PATENT DOCUMENTS

| | | | |
|---|---|---|---|
| JP | 59-150440 | | 8/1984 |
| JP | 60-054446 | | 3/1985 |
| JP | 60-244034 | | 12/1985 |
| JP | 60244034 A | * | 12/1985 |
| JP | 61-078131 | | 4/1986 |
| JP | 07-183323 | | 7/1995 |
| JP | 07-273138 | | 10/1995 |
| JP | 2008-130825 A | | 5/2006 |
| JP | 2007-294975 | | 11/2007 |

* cited by examiner

GAS DELIVERY SYSTEM FOR REDUCING OXIDATION IN WIRE BONDING OPERATIONS

CROSS-REFERENCE TO RELATED APPLICATION

This application claims the benefit of the U.S. patent application Ser. No. 12/739,100 filed on Apr. 21, 2010, which claims the benefit of International Application No. PCT/US2009/046535 filed on Jun. 8, 2009 which claims the benefit of U.S. Provisional Application No. 61/060,189, filed Jun. 10, 2008, the contents of which are incorporated herein by reference.

FIELD OF THE INVENTION

The present invention relates to wire bonding of semiconductor devices, and more particularly, to providing a cover gas to certain areas of a wire bonding machine.

BACKGROUND OF THE INVENTION

In the manufacturer of various semiconductor devices, wire bonding techniques are often used to connect components in the devices. For example, wire bonds (or wire loops) are often used to provide interconnection between a semiconductor die and contacts on a leadframe. An exemplary conventional wire bonding operation involves (1) bonding a free air ball to a first bonding location on a die (e.g., using ball bonding) to form a first bond, (2) extending a wire from the first bond toward a second bonding location on a leadframe, (3) bonding the end of the extended wire to the second bonding location to form a second bond, and (4) cutting the wire. In such a ball bonding operation, an electronic flame off (i.e., EFO) wand/electrode or the like is typically used to form the free air ball at the end of the wire at step (1).

Often, gold wire (which is substantially non-reactive with oxygen) is used in wire bonding processes; however, in certain applications, more reactive metals (e.g., copper, silver, palladium, aluminum, etc.) are used. These more reactive metals may react, for example, in the presence of oxygen and form oxides/oxidation on the wires (and/or wire ends or tails) which are undesirable for wire bonding.

In view of such potential oxidation, certain wire bonding systems include subsystems for providing a cover gas to the end of a wire during formation of the free air ball by the EFO wand. For example, U.S. Pat. No. 6,234,376, which is incorporated by reference in its entirety, discloses such a system.

Additionally, various subsystems of wire bonding machines are used to provide the cover gas to the bond site area of the wire bonding machine to reduce the potential for oxidation of the bonding wire in the bond site area. Exemplary subsystems for providing a cover gas in the bond site area include U.S. Patent Application Publication Nos. 2007/0284421; 2007/0251980; and U.S. Pat. Nos. 5,265,788; 5,395,037; 6,866,182; and 7,182,793.

It would be desirable to provide improved structures for reducing oxidation in wire bonding.

SUMMARY OF THE INVENTION

According to an exemplary embodiment of the present invention, a wire bonding machine is provided. The wire bonding machine includes a bonding tool and an electrode for forming a free air ball on an end of a wire extending through the bonding tool where the free air ball is formed at a free air ball formation area of the wire bonding machine. The wire bonding machine also includes a bond site area for holding a semiconductor device during a wire bonding operation. The wire bonding machine also includes a gas delivery mechanism/system (e.g., a gas delivery structure) configured to provide a cover gas to: (1) the bond site area whereby the cover gas is ejected through at least one aperture of the gas delivery mechanism to the bond site area, and (2) the free air ball formation area.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1A:
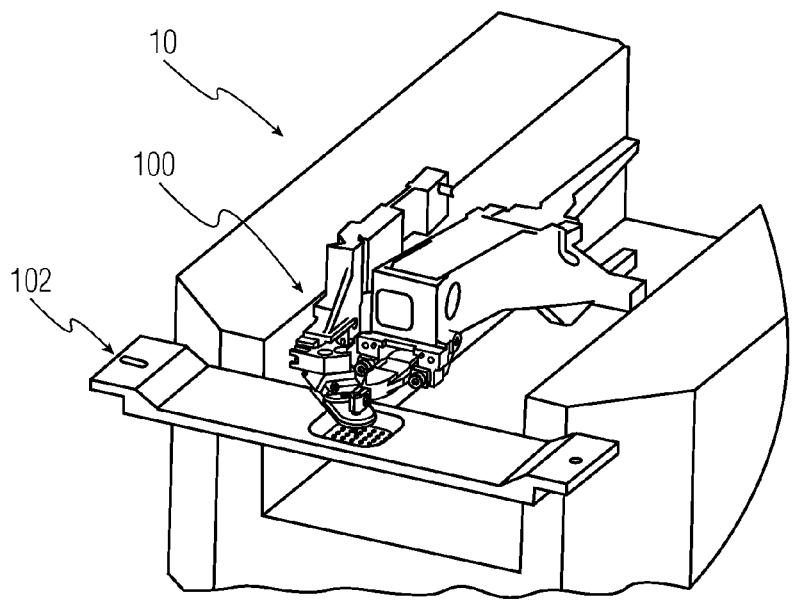
FIG. 1A is a perspective view of a portion of a wire bonding system in accordance with an exemplary embodiment of the present invention.

U.S. Pat. No. 6,234,376, as well as United States Patent Publication Nos. 2007/0284421 and 2007/0251980, relate to oxidation reduction systems for wire bonding technology, and are herein incorporated by reference in their entirety.

As is understood by those skilled in the art, the bond site area refers to the portion of a wire bonding machine where the actual formation of wire bonds (i.e., bonding or welding a portion of a wire to a bonding location) occurs. For example, a leadframe strip carrying devices may be supported by a heat block of the wire bonding machine, and may be secured by a clamp of the wire bonding machine, during a wire bonding operation. In such a case, during wire bonding, the portion of the leadframe/devices accessible through a device aperture(s) of the window clamp may be viewed as the bond site area. Further, as is understood by those skilled in the art, the free air ball formation area is the location where free air balls are formed during wire bonding. Such a location tends to be defined by other components including the location of the tip of an electrode for forming the free air balls, the location of the bonding tool, the location/length of the wire extending from the bonding tool, etc. (which locations may differ or be altered from machine to machine).

The present invention relates to gas delivery mechanisms/systems that integrate a cover gas (e.g., a forming gas) flow into each of (1) the electronic flame-off area where free air balls are to be formed (i.e., the free air ball formation area), and (2) the bond site area. In certain embodiments, an EFO electrode is positioned at least partially within the gas delivery system without interfering with gas flow to either of the locations. The cover gas provided to the EFO area reduces the potential for oxidation during free-air-ball formation (e.g., during free air ball formation of copper wire) while the cover gas provided to the bond site area reduces the potential for oxidation of the wire during the bonding operation. By providing cover gas to the free air ball formation area and the bond site area using a single mechanism/structure, a number of advantages are achieved. For example, a simple cost effective mechanism is provided. Additionally, visibility and access during the wire bonding operation are facilitated by the reduction of multiple structures on the wire bonding machine. Further still, a desirable range of motion for the bond head may be facilitated in contrast to other arrangements.

According to certain exemplary embodiments of the present invention, a gas (e.g., a cover gas such as a gas including nitrogen, argon, etc.) (where the gas may or may not include a reducing gas such as hydrogen) is provided: (1) in the vicinity of the electronic flame off operation of a wire bonding machine; and (2) in the vicinity of the bond site area of a wire bonding machine. For example, during a wire bonding operation, a constant (or variable or controlled) supply of the gas may be provided: (1) in the vicinity of the electronic flame off operation of a wire bonding machine; and (2) in the vicinity of the bond site area of a wire bonding machine, such that during the wire bonding operation there is a reduced potential for oxidation of the wires. Depending upon the gas (and temperature) used, there may also be a reduction of oxide/oxidation already present on the wires, similar to the effect of applying a reducing gas during formation of a free air ball.

For example, during formation of free air balls used during ball bonding, it is desirable to provide a cover gas to reduce the potential for oxidation of the wire/free air ball because such oxidation may result in an undesirable wire bond and the like. Further, during a wire bonding operation, after completing a wire loop (and prior to forming the next free air ball) a wire tail (e.g., the end portion of wire suspended from a capillary tip) may be subjected to oxygen or the like resulting in oxides forming on the wire tail. Such oxides may be undesirable for bonding, even if the wire tail is later formed into a free air ball. Of course, there are other phases of the wire bonding operation during which it is desirable to reduce the potential for oxidation of the wire (and/or wire ends) such as, for example, (1) when forming the second bond in the bond site area, (2) when lowering a formed free air ball to the bond site area, amongst others. The present invention addresses these situations by providing a supply of the gas: (1) in the vicinity of the electronic flame off operation of a wire bonding machine; and (2) in the vicinity of the bond site area of a wire bonding machine.

Figure 1B:
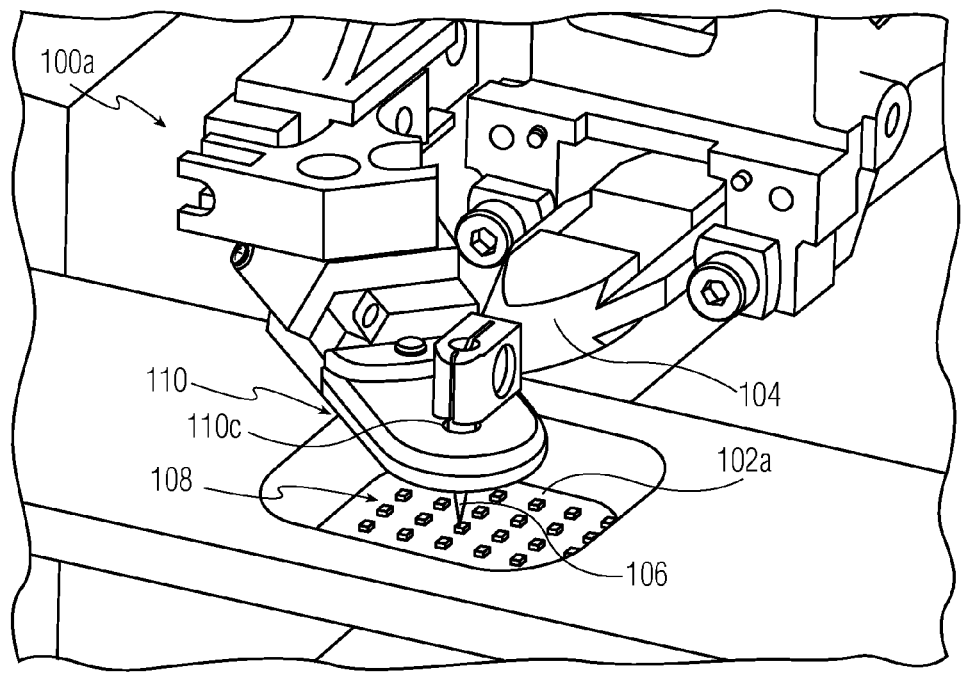
FIG. 1B is a detailed view of a portion of FIG. 1A.

FIG. 1A illustrates wire bonding machine 10 (with various components removed for simplicity). Wire bonding machine 10 includes bond head assembly 100 which includes various components which are moved (e.g., using an XY table of the wire bonding machine) to form wire loops between bonding locations. Wire bonding machine 10 also includes device clamp 102 (sometimes referred to as a window clamp or a clamp insert) which secures the device to be wire bonded into place (e.g., on a heat block of the wire bonding machine). Referring now to the detailed view provided in FIG. 1B, various elements carried by bond head 100 are illustrated including transducer 104 and bonding tool 106. Also shown is gas delivery mechanism 110, through which bonding tool 106 extends. More specifically, bonding tool 106 extends through aperture 110c of gas delivery mechanism 110. Bonding tool 106 is used to form wire loop interconnects between bonding locations. The bonding locations are part of bond site area 108 which is accessible to bonding tool 106 through device aperture 102a (also known as a window) of device clamp 102. As will be explained in greater detail below, gas delivery mechanism 110 is used to provide a gas (e.g., a cover gas) to (1) the vicinity of the electronic flame off operation of a wire bonding machine, and (2) the vicinity of the bond site area of a wire bonding machine. As shown in FIG. 1B, in this example gas delivery mechanism 110 is supported by EFO (electronic flame-off) electrode support structure 100a, which is carried by the XY table of wire bonding machine 10.

Figure 1C:
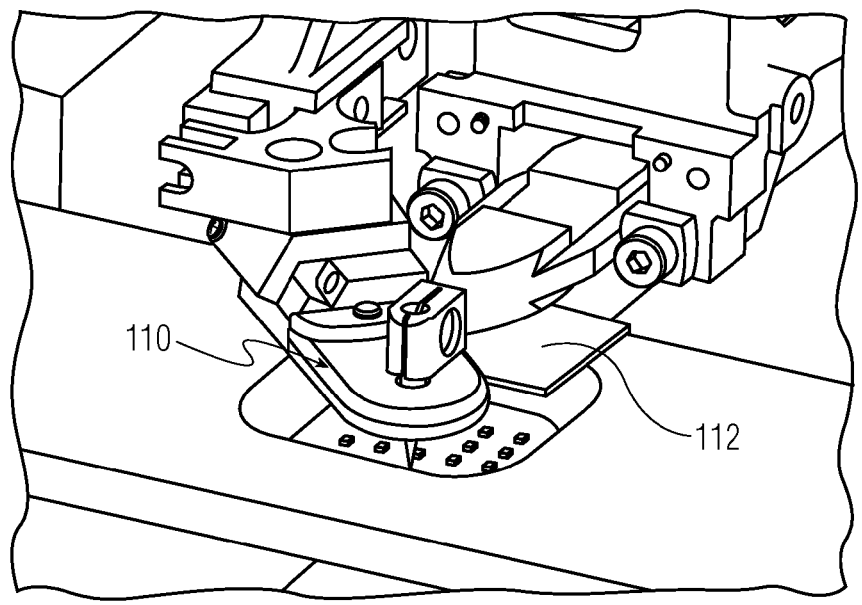
FIG. 1C is a perspective view of a gas delivery mechanism including a cover for covering a portion of a window of a device clamp in accordance with an exemplary embodiment of the present invention.

FIG. 1C illustrates an exemplary embodiment of the present invention in which cover 112 is provided over a portion of device aperture 102a of device clamp 102. For example, cover 112 may be secured to gas delivery mechanism 110 (or some other portion of EFO electrode support structure 100a) such that cover 112 is presented (e.g., by XY table motion) to cover a portion of device aperture 102a, thereby reducing the rate at which the cover gas escapes bond site area 108 (thereby saving cover gas costs, and improving the usefulness of the cover gas in reducing the potential for oxidation of portions of the bonding wire).

Figure 1D:
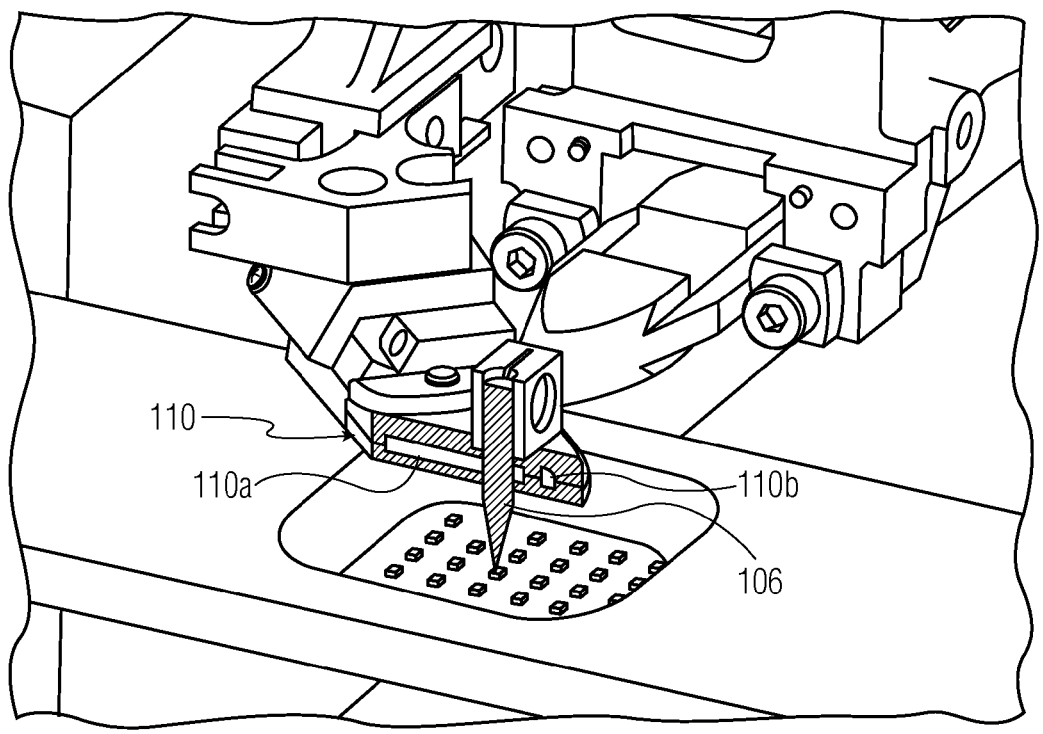
FIG. 1D is a top detailed view of a portion of FIG. 1A.

FIG. 1D is a cross sectional perspective view of gas delivery mechanism 110 illustrating a portion of cavities 110a and 110b of gas delivery mechanism 110. In FIG. 1D, bonding tool 106 is shown in a bonding position where the tip end of the bonding tool is used to bond a portion of wire (not shown) to bonding locations in bond site area 108; however, it is understood that in a free air ball forming position, bonding tool 106 is raised (in comparison to the view of FIG. 1D) such that the tip end portion of bonding tool 106 is within/adjacent gas delivery mechanism 110. In such a position, an electronic flame off wand (shown in FIGS. 1G and 1H) is used to form a free air ball on an end of a wire extending from the tip end of bonding tool 106. Because the free air ball is formed within/adjacent a gas filled cavity of gas delivery mechanism 110 the free air balls may be formed in an environment with a reduced potential for oxidation.

Figure 1E:
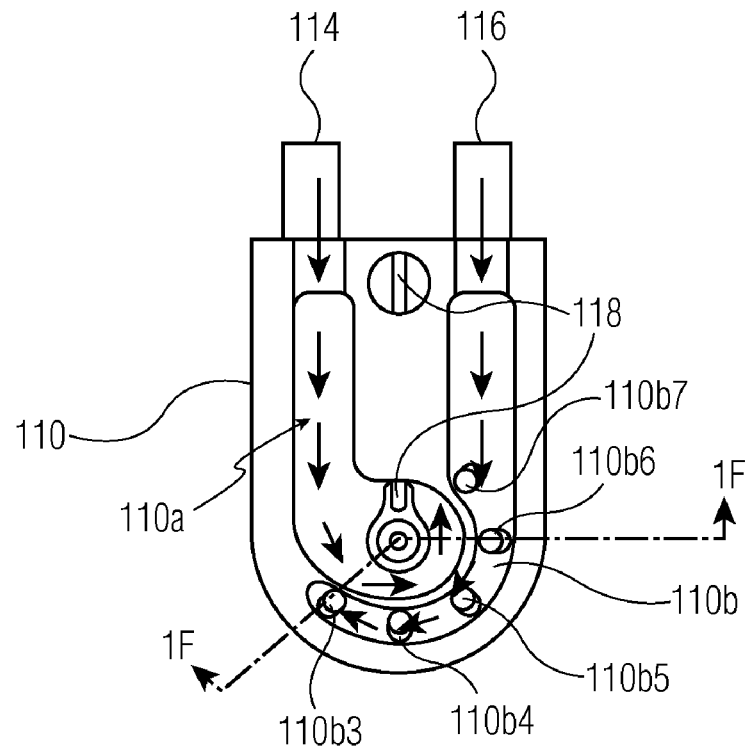
FIG. 1E is a top view of a portion of the gas delivery mechanism for the wire bonding machine of FIG. 1A in accordance with an exemplary embodiment of the present invention.

Gas delivery mechanism 110 may include a top portion and a bottom portion which collectively define cavities 110a and 110b. FIG. 1E illustrates internal portions of gas delivery mechanism 110 (i.e., the top of gas delivery mechanism 110 is transparent in the illustration). Gas delivery mechanism 110 defines cavity 110a and cavity 110b. Cavity 110a defines a gas delivery path between (1) a first gas inlet 114 (e.g., a gas supply pipe or tube 114), and (2) the vicinity of the electronic flame-off operation. More specifically, as shown in FIG. 1E by the arrows, gas flow (e.g., a controlled gas supply) is provided to first gas inlet 114. The gas flows from first gas inlet 114 along the path provided by cavity 110a. The path provided by cavity 110a extends to the area where free air balls are to be (i.e., the vicinity of the electronic flame-off operation, also known as the free air ball formation location). As shown in FIG. 1E, electrode 118 (i.e., an electrode of an electronic flame-off device used to form free air balls) extends through gas delivery mechanism 110 such that the tip of electrode 118 terminates within cavity 110a. As is known to those skilled in the art, an electronic flame-off device typically includes an electrode (such as electrode 118) which is used to melt an end of a wire extending from a bonding tool (such as bonding tool 106) to form a free air ball. As shown in FIG. 1E, gas flows through cavity 110a around bonding tool 106 and adjacent the tip of electrode 118, thereby providing the gas in the vicinity of the electronic flame-off operation (the gas flow is illustrated by the series of arrows).

Also shown in FIG. 1E is cavity 110b. Cavity 110b defines a gas delivery path between (1) second gas inlet 116 (a gas supply pipe or tube 116), and (2) the vicinity of the bond site area of a wire bonding machine. More specifically, as shown in FIG. 1E in by the arrows, gas flow (e.g., a controlled gas supply) is provided to second gas inlet 116. The gas flows from second gas inlet 116 along the path provided by cavity 110b. The path provided by cavity 110a extends to a plurality of through holes 110b3, 110b4, 110b5, 110b6, and 110b7. As shown in FIG. 1E, gas flows through cavity 110b, leading to (and through) through holes 110b3, 110b4, 110b5, 110b6, and 110b7. The gas then flows from through holes 110b3, 110b4, 110b5, 110b6, and 110b7 downward toward the bond site area of the wire bonding machine, thereby providing gas to the bond site area to reduce the potential for oxidation of the wire and/or wire ends.

Figure 1F:
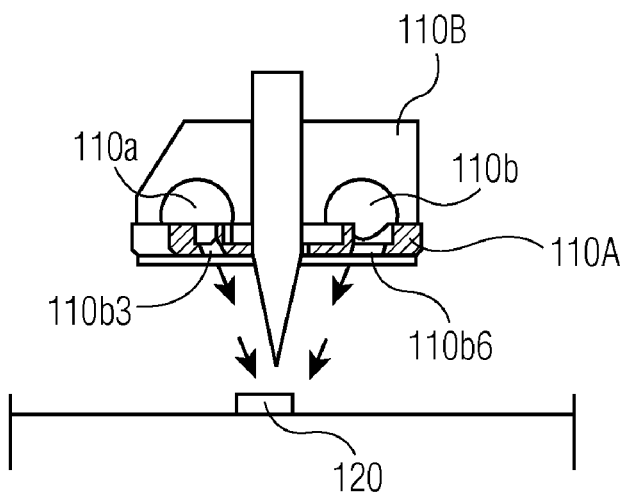
FIG. 1F is a front view of a portion of FIG. 1G taken along line 1F-1F.

FIG. 1F is a front view of a portion of FIG. 1E taken along line 1E-1E which illustrates top portion 110B and bottom portion 110A of gas delivery mechanism 110. This sectional view provides a view of a portion of cavities 110a and 110b, as well as a view of a portion of through holes 110b3 and 110b6. As shown in FIG. 1E, gas flows (as indicated by the arrows) past through holes 110b3 and 110b6 toward bond site area 108 (device 120, to be wirebonded, is located at bond site area 108).

Figure 1G:
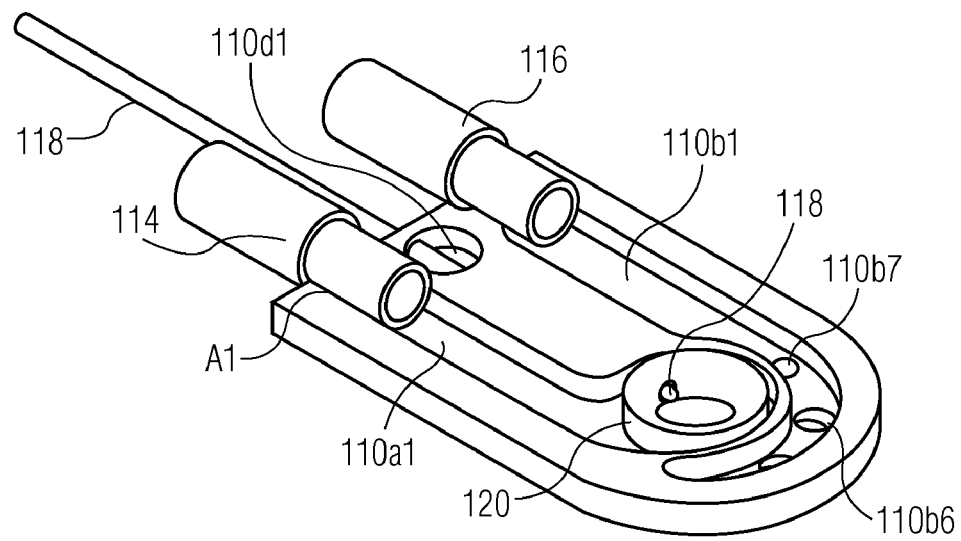
FIG. 1G is a perspective view of a bottom portion of a housing of the gas delivery mechanism for the wire bonding machine of FIG. 1A with an insulator adjacent a tip end portion of an electrode in accordance with an exemplary embodiment of the present invention.
Figure 1H:
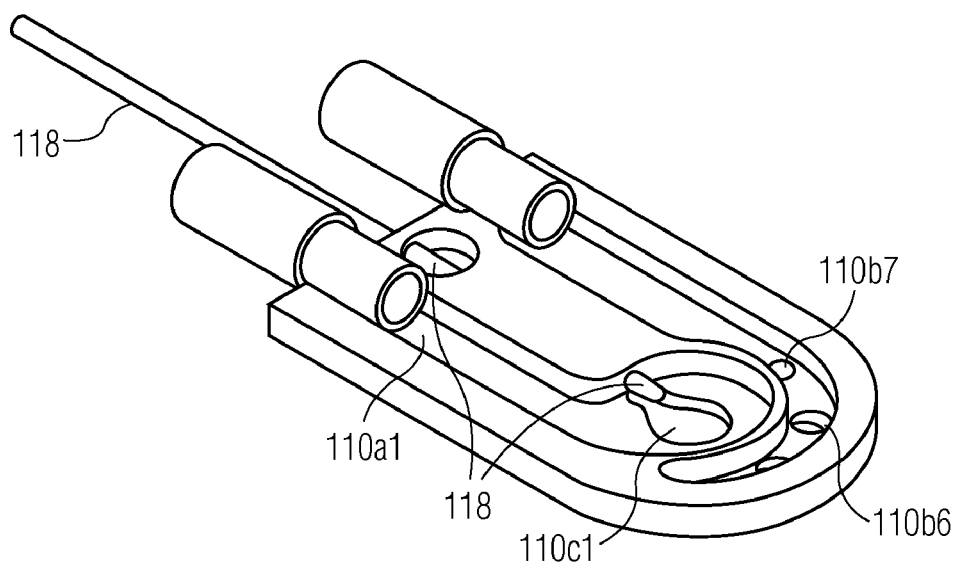
FIG. 1H is a perspective view of a bottom portion of a housing of the gas delivery mechanism for the wire bonding machine of FIG. 1A without an insulator adjacent a tip end portion of an electrode in accordance with an exemplary embodiment of the present invention.

As provided above, gas delivery mechanism 110 includes top portion 110A and bottom portion 110A. FIGS. 1G-1H illustrate two variations of bottom portion 110B. As shown in FIGS. 1G-1H, bottom portion 110B defines bottom portion 110a1 of cavity 110a. Likewise, bottom portion 110B defines bottom portion 110b1 of cavity 110b (including through holes 110b3, 110b4, 110b5, 110b6, and 110b7). Top portion 110B, not shown in FIGS. 1G-1H, defines corresponding portions of cavities 110a and 110b). Further, bottom portion 110A defines aperture portion 110c1 of aperture 110c configured to receive bonding tool 106 (e.g., see FIG. 1B) (top portion 110B, not shown, defines a corresponding portion of aperture 110c). Also shown in FIGS. 1G and 1H are recesses A1, A2 defined in bottom portion 110A. These recesses A1 and A2, in conjunction with corresponding recesses in top portion 11oB (not shown), receive gas inlets 114 and 116 (e.g., gas supply pipes 114 and 116). Gas inlets 114 and 116 provide gas to cavities 110a and 110b, respectively. FIGS. 1G-1H also illustrate two different configurations for the tip end of electrode 118. That is, in FIG. 1G insulator 120 (e.g., an insulative bushing made of ceramic or the like) is provided at the tip end of electrode 118. Insulator 120 is provided to direct the spark from electrode 118 towards the end of the wire to form a free air ball (the wire is not shown in FIG. 1G). More specifically, the spark is directed from the very tip of electrode 118 as opposed to some point farther along the length of electrode 118. Further, an insulative sealant or adhesive may be provided at the opening of insulator 120 which receives the tip end of electrode 118 to further direct the spark. In contrast, in FIG. 1H, the tip end of electrode 118 is not received by an insulator such as insulator 120.

While the exemplary embodiments of the present invention illustrated in FIGS. 1A-1H includes two gas supply sources (i.e., gas provided through gas inlets/pipes 114 and 116), it is understood that a single gas supply source/pipe could supply gas to gas supply mechanism 110.

Figure 2:
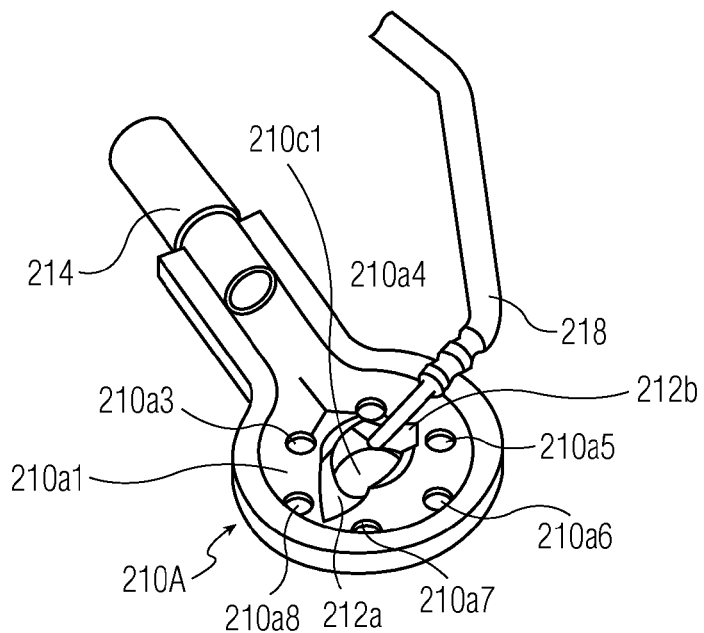
FIG. 2 is a top perspective view of a portion of another gas delivery mechanism in accordance with an exemplary embodiment of the present invention.
Figure 3:
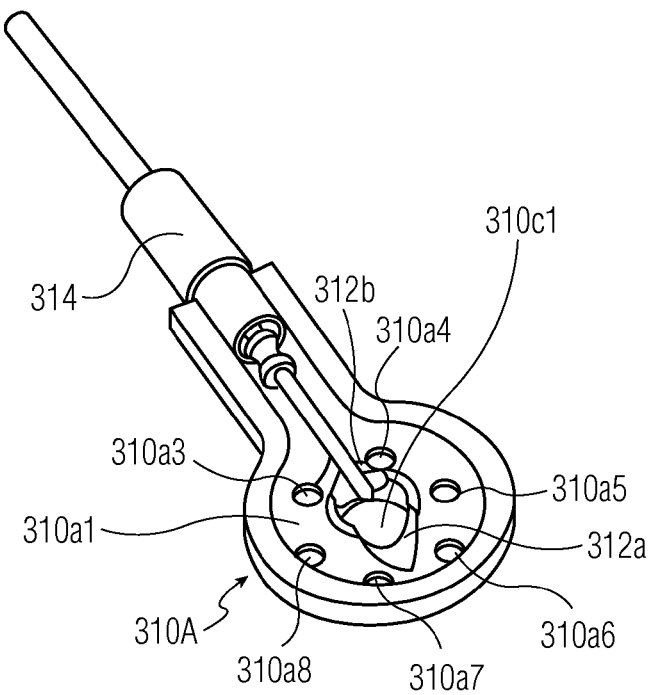
FIG. 3 is a top perspective view of a portion of yet another gas delivery mechanism in accordance with an exemplary embodiment of the present invention.
Figure 4A:
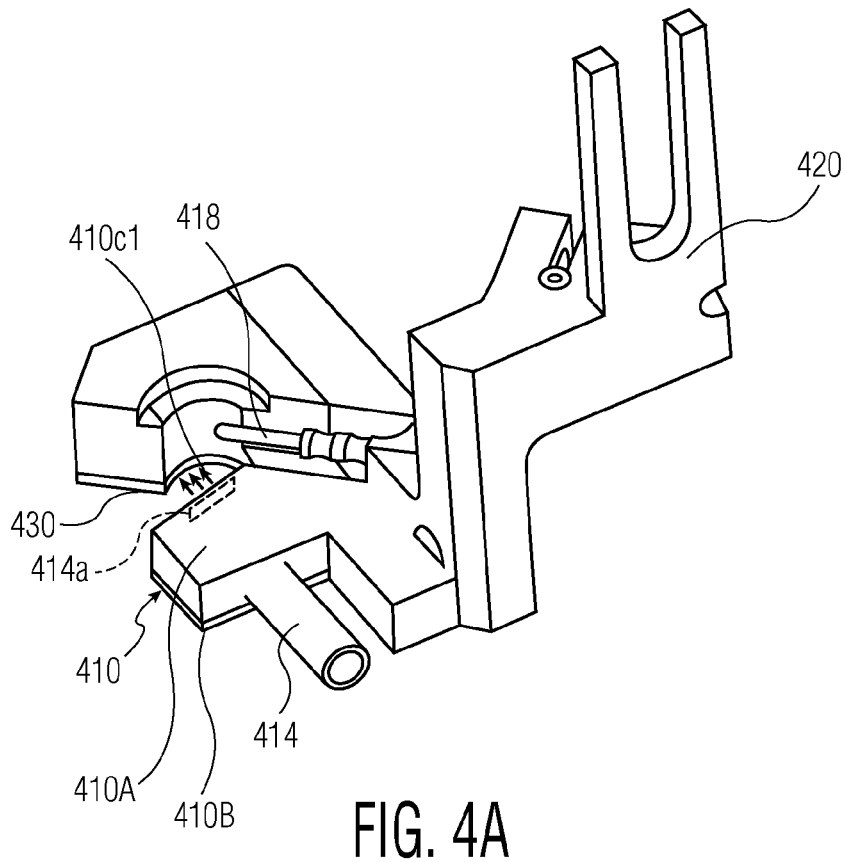
FIG. 4A is a top perspective view of a portion of yet another gas delivery mechanism in accordance with an exemplary embodiment of the present invention.
Figure 4B:
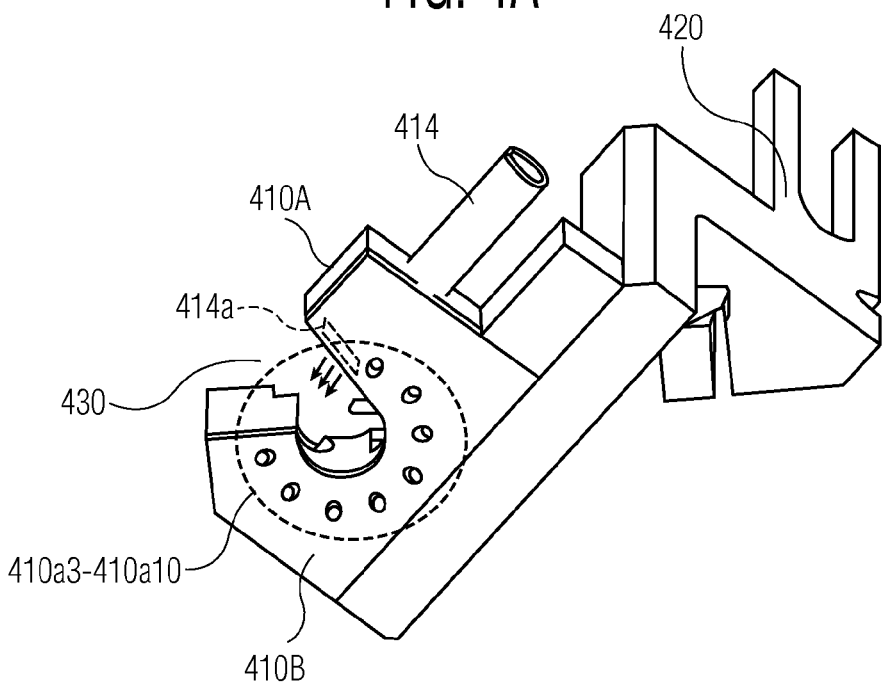
FIG. 4B is a bottom perspective view of the portion of the gas delivery mechanism of FIG. 4A.

As described above with respect to FIGS. 1A-1L, a gas delivery mechanism for providing gas (1) in the vicinity of the electronic flame off operation of a wire bonding machine, and (2) in the vicinity of the bond site area of a wire bonding machine, is provided. However, the present invention is not limited to the configuration shown in FIGS. 1A-1H. In fact, there are multiple configurations contemplated within the scope of the present invention. Various additional exemplary configurations are illustrated in FIG. 2; FIG. 3; FIGS. 4A-4B; FIGS. 5A-5C, FIGS. 6A-6E, and FIGS. 7A-7E.

Referring to FIG. 2, bottom portion 210A of a gas delivery mechanism is illustrated (the top portion, which acts in a manner similar to top portion 110B described above, is omitted for simplicity). A gas delivery cavity is defined in the gas delivery mechanism, with the cavity being partially defined by bottom cavity portion 210a1 (and also by the top portion, not shown). Bottom portion 210A receives gas from gas inlet 214 (e.g., gas supply pipe 214). A tip end of electrode 218 extends into area 210c1 where the flame-off operation for forming free air balls is to be conducted. Bottom portion 210A also defines apertures 210a3, 210a4, 210a5, 210a6, 210a7, and 210a8. When gas is delivered to the gas delivery mechanism via gas inlet/pipe 214, the gas extends through the cavity and to: (1) area 210c1 for forming free air balls, where the gas travels from the cavity to area 210c1 through apertures 212a and 212b, and (2) the bond site area via apertures 210a3, 210a4, 210a5, 210a6, 210a7, and 210a8.

Referring to FIG. 3, the bottom portion 310A of a gas delivery mechanism is illustrated (the top portion, which acts in a manner similar to top portion 110B described above, is omitted for simplicity). A gas delivery cavity is defined in the gas delivery mechanism, with the cavity being partially defined by bottom cavity portion 310a1 (and also by the top portion, not shown). Bottom portion 310A receives gas from gas supply inlet 314 (e.g., gas supply pipe 314). Electrode 318 extends through gas inlet/pipe 314, and the tip end of electrode 318 extends into area 310c1 where the flame-off operation for forming free air balls is to be conducted. Bottom portion 310A also defines apertures 310a3, 310a4, 310a5, 310a6, 310a7, and 310a8. When gas is delivered to the gas delivery mechanism via gas inlet/pipe 314, the gas extends through the cavity and to: (1) area 310c1 for forming free air balls, where the gas travels from the cavity to area 310c1 through apertures 312a and 312b and (2) the bond site area via 310a3, 310a4, 310a5, 310a6, 310a7, and 310a8.

FIGS. 4A-4B illustrate gas delivery mechanism 410. Gas delivery mechanism 410 includes top portion 410A and bottom portion 410B which collectively define an internal cavity for receiving gas from gas inlet/supply pipe 414. Gas delivery mechanism 410 includes anchoring structure 420 for anchoring gas delivery mechanism 410 to a support structure of the wire bonding machine. A tip end of electrode 418 extends to area 410c1 for forming free air balls. Bottom portion 410B defines apertures 410a3, 410a4, 410a5, 410a6, 410a7, 410a8, 410a9 and 410a10. When gas is delivered to the gas delivery mechanism 410 via gas inlet/pipe 414, the gas extends through the internal cavity and to: (1) the area 410c1 for forming free air balls, where the gas travels from the cavity to area 210c1 through aperture 414a (see arrows indicating gas flow), and (2) the bond site area via 410a3, 410a4, 410a5, 410a6, 410a7, 410a8, 410a9 and 410a10. Gas delivery mechanism 410 also defines side opening 430 which allows, for example, access for an operator and/or for a wire bonding tool to be positioned (e.g., swung or otherwise moved) adjacent area 410c1 for forming free air balls.

Figure 5A:
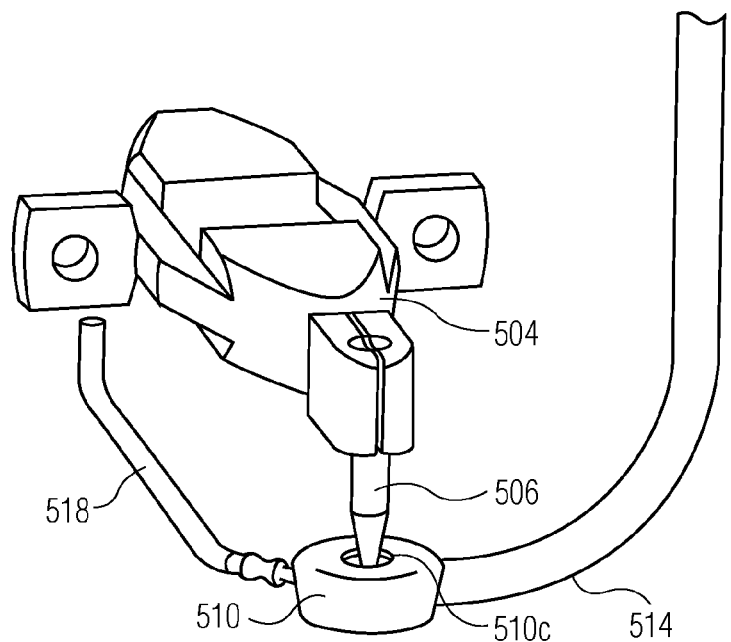
FIG. 5A is a front perspective view of elements of a wire bonding machine including gas delivery mechanism elements in accordance with an exemplary embodiment of the present invention.
Figure 5B:
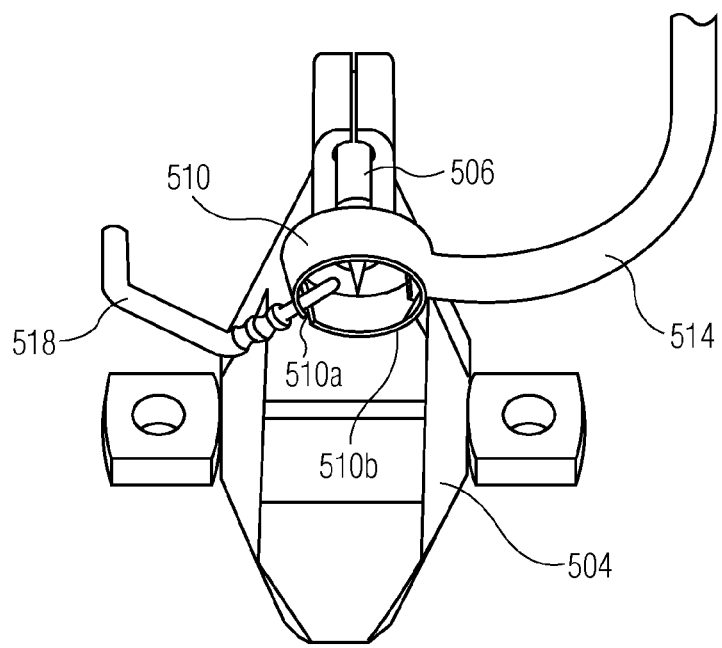
FIG. 5B is a bottom perspective view of the elements of FIG. 5A.
Figure 5C:
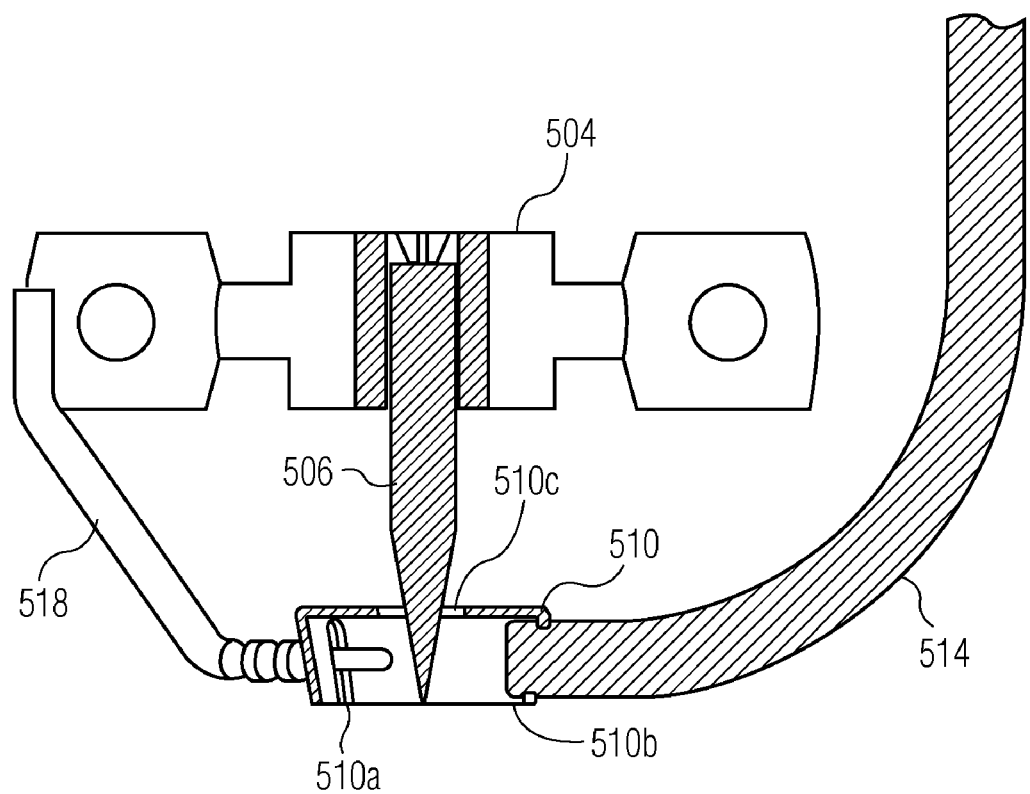
FIG. 5C is a front view of the elements of FIG. 5A.
Figure 6A:
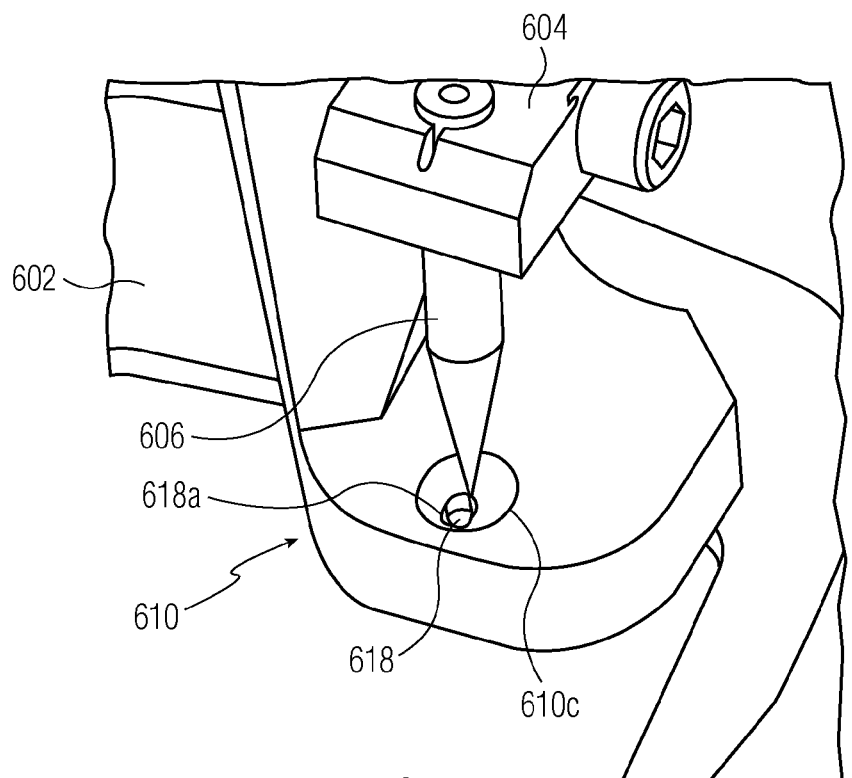
FIG. 6A is a front perspective view of a portion of a gas delivery mechanism integrated with certain components of a wire bonding machine in accordance with an exemplary embodiment of the present invention.
Figure 6B:
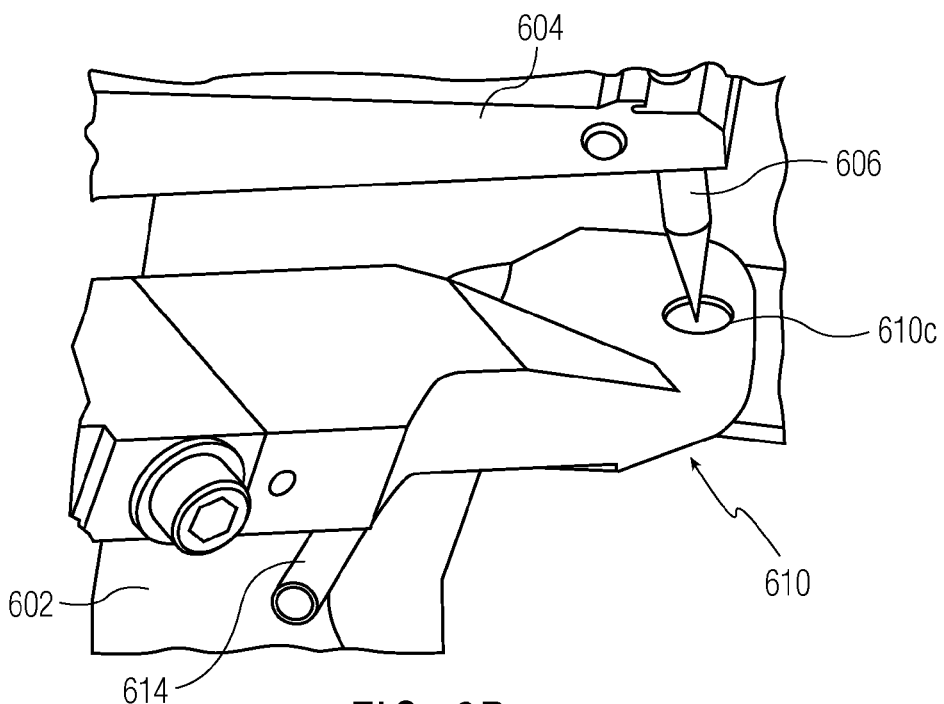
FIG. 6B is a side perspective view of a portion of the gas delivery mechanism of FIG. 6A.
Figure 6C:
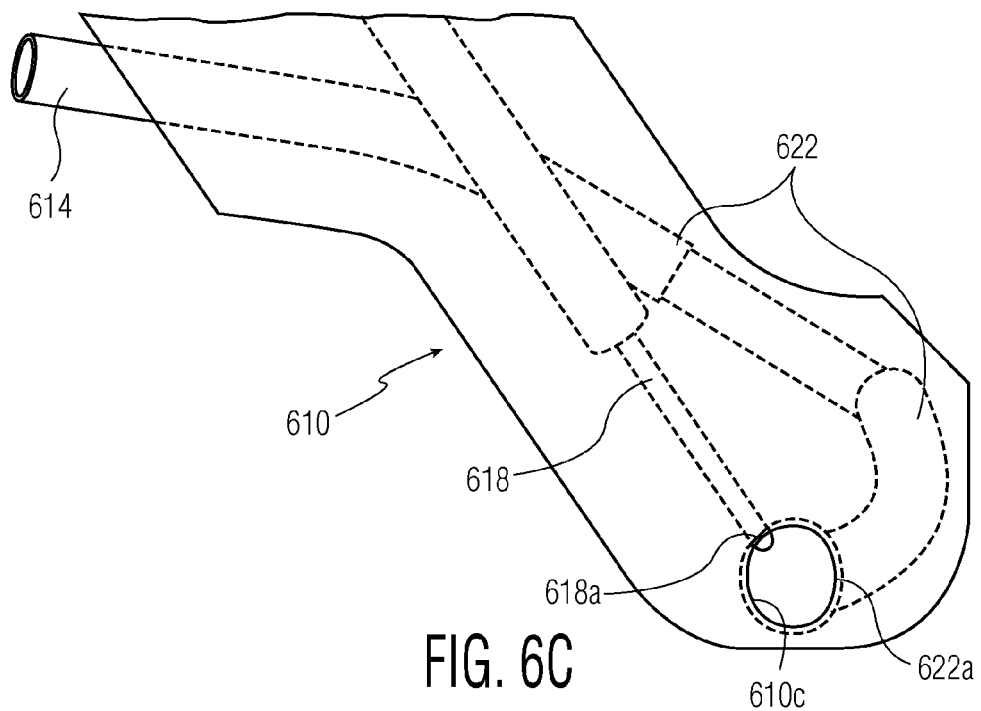
FIG. 6C is a top view of a portion of the gas delivery mechanism of FIG. 6A with certain internal details shown in hidden lines.
Figure 6D:
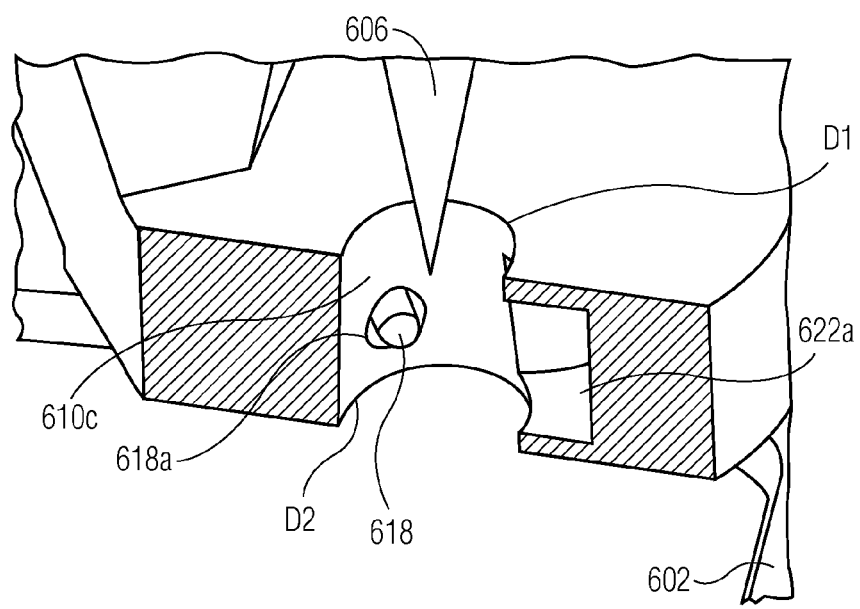
FIG. 6D is a cut-away front perspective view of a portion of the gas delivery mechanism of FIG. 6A.
Figure 7A:
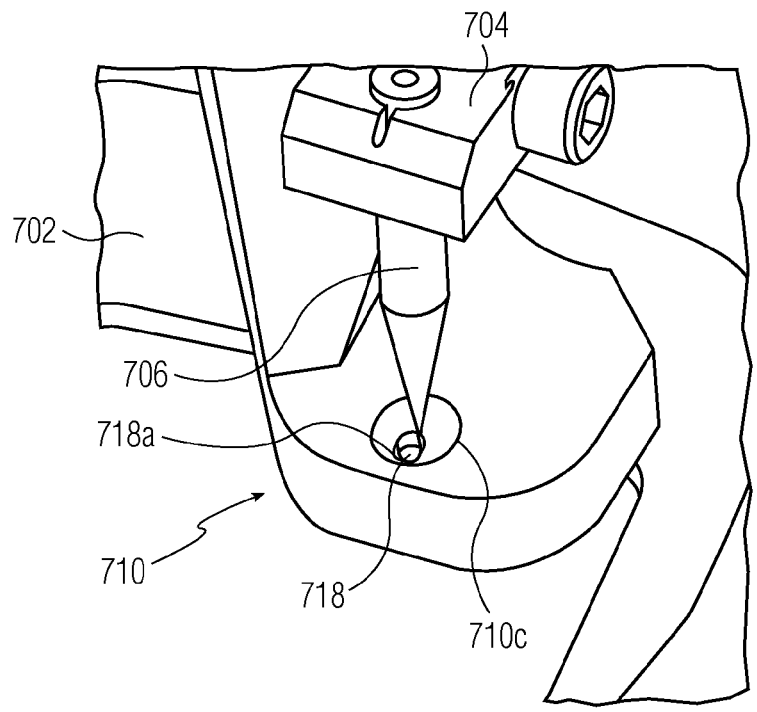
FIG. 7A is a front perspective view of a portion of a gas delivery mechanism integrated with certain components of a wire bonding machine in accordance with an exemplary embodiment of the present invention.
Figure 7B:
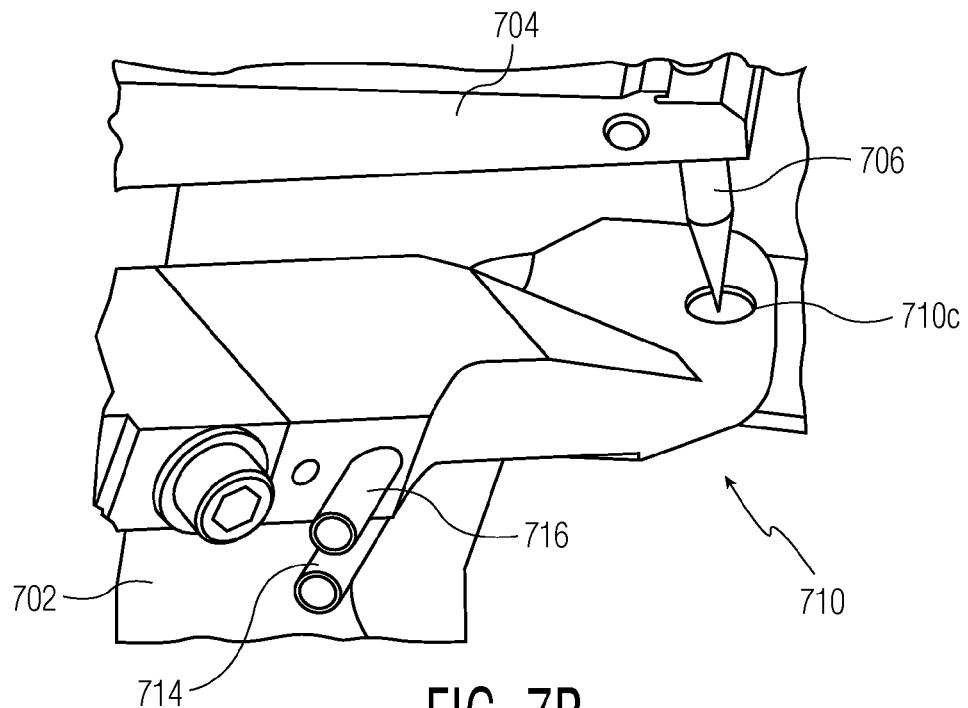
FIG. 7B is a side perspective view of a portion of the gas delivery mechanism of FIG. 7A.
Figure 7C:
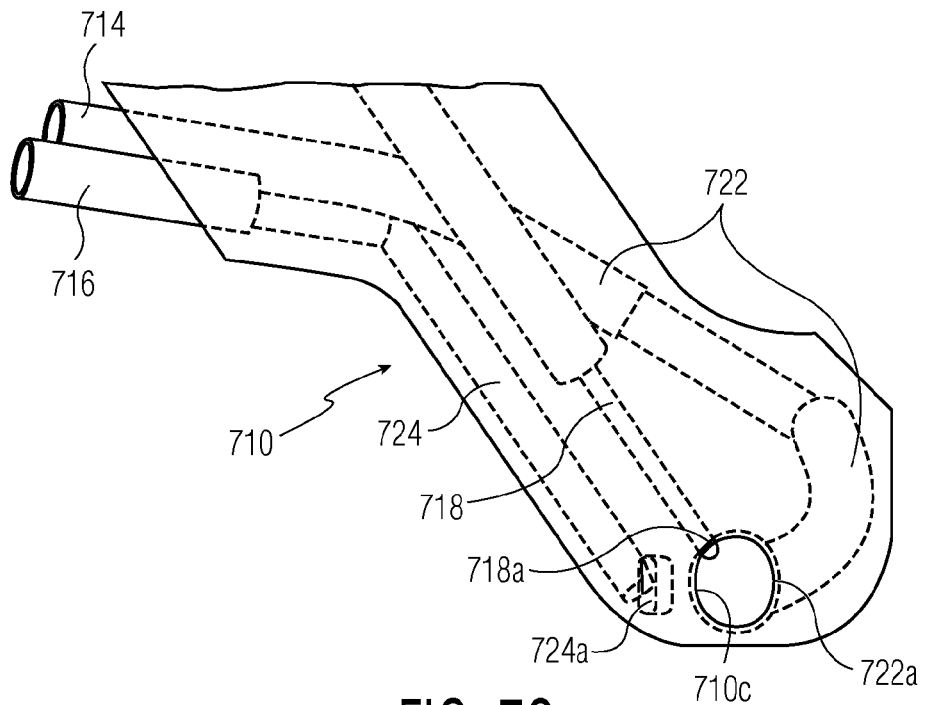
FIG. 7C is a top view of a portion of the gas delivery mechanism of FIG. 7A with certain internal details shown in hidden lines.
Figure 7D:
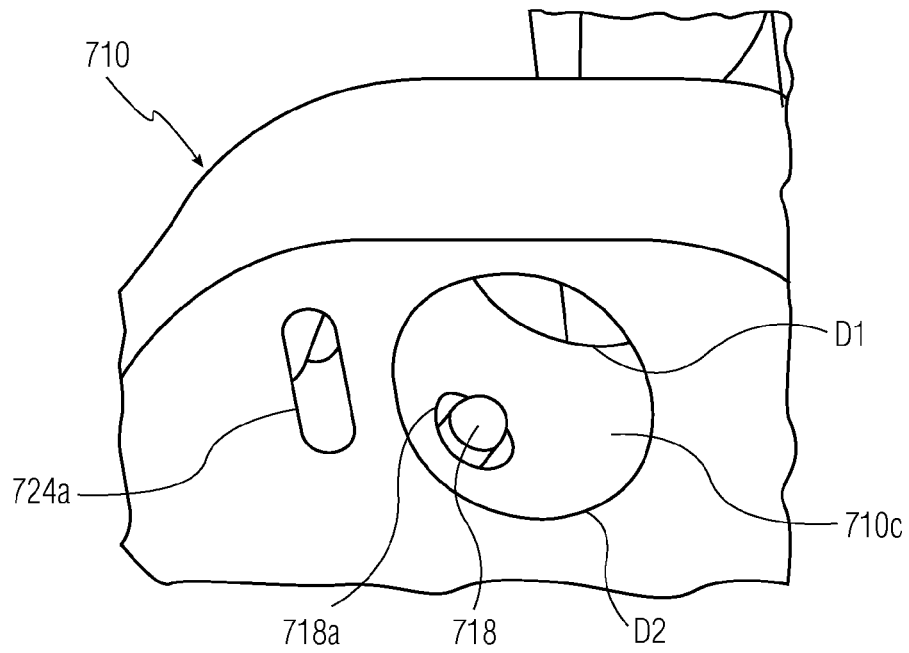
FIG. 7D is a bottom perspective view of a portion of the gas delivery mechanism of FIG. 7A.
Figure 7E:
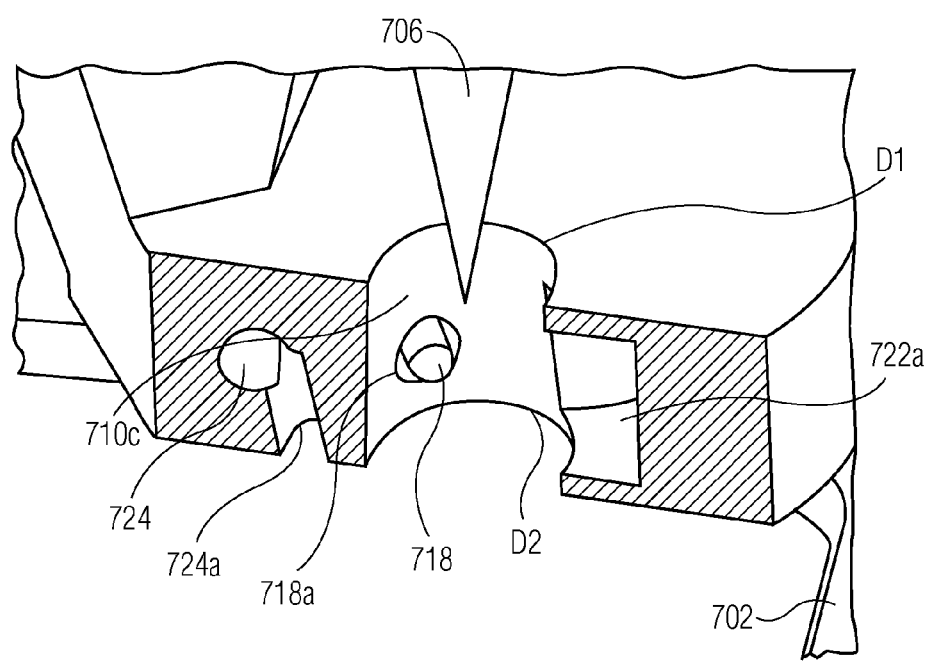
FIG. 7E is a cut-away front perspective view of a portion of the gas delivery mechanism of FIG. 7A.

FIGS. 5A-5C illustrate certain components of a wire bonding machine in connection with gas delivery mechanism 510 (e.g., including a tapered or funnel-shaped body portion). More specifically, transducer 504 (e.g., an ultrasonic transducer) holds bonding tool 506. A tip end of bonding tool 506 is configured to extend through aperture 510c of gas delivery mechanism 510 (as shown in FIGS. 5A-5C) for formation of free air balls. Gas supply pipe 514 supplies gas to gas delivery mechanism 510 via aperture 510b. A tip end of electrode 518 extends into a free air ball forming area of gas delivery mechanism 510 via aperture 510a. When gas is delivered to the gas delivery mechanism 510 via gas delivery pipe 514, the gas extends to: (1) the area inside gas delivery mechanism 510 for forming free air balls, and (2) the bond site area via the enlarged opening at the bottom of gas delivery mechanism 510 (as illustrated in FIG. 5B). The funnel-shaped sidewalls of gas delivery mechanism 510 are tapered, and aperture 510c at the top of gas delivery mechanism 510 is smaller than the large opening at the bottom of gas delivery mechanism 510 (See FIG. 5C where diameter D1 is clearly smaller than diameter D2). Thus, gas that is ejected from gas delivery mechanism 10 will mostly exit through the enlarged opening at the bottom, and not through aperture 510c. This is particularly true when bonding tool 506 extends through aperture 510c, thereby partially blocking potential gas escape through aperture 510c.

FIGS. 6A-6D illustrate various views of a portion of gas delivery mechanism 610, and other portions of a wire bonding machine similar to those shown in FIGS. 1A-1H. More specifically, the wire bonding machine includes device clamp 602, transducer 604, bonding tool 606, and gas delivery mechanism 610. Also shown in FIGS. 6A-6D is electrode 618, where a tip of electrode 618 extends through aperture 618a of gas delivery mechanism 610. Gas delivery mechanism 610 defines tapered through hole 610c which is configured to receive bonding tool 606 during a wire bonding operation. In this exemplary embodiment of the present invention, through hole 610c is the free air ball formation area. More specifically, during formation of a free air ball, an end of a wire extending from bonding tool 606 is positioned in the free air ball formation area (i.e., in through hole 610c). A tip end of electrode 618, which is used to form a free air ball on the end of the wire, is also positioned in the free air ball formation area. A cover gas is provided via gas inlet 614, and the cover gas travels through cavity/path 622 and exits at gas outlet 622a into through hole 610c. Thus, the cover gas provides protection against oxidation during the formation of free air balls in through hole 610c.

During a wire bonding operation bonding tool 606 extends further downward into (and at least partially past) through hole 610c to form wire bumps or wire loops on a device to be wirebonded at the bond site area. The cover gas that was ejected from gas outlet 622a into through hole 610c tends to travel downward through the lower opening of through hole 610c to bond site area. More specifically, because through hole 610 is tapered, the diameter of through hole 610c is smaller at the top of gas delivery mechanism 610 when compared to the diameter of the through hole at the bottom (i.e., diameter D1 is smaller than diameter D2 in FIG. 6D). Thus, more cover gas would tend to exit through hole 610c at the bottom than at the top. Additionally, during certain portions of the wire bonding operation bonding tool 606 will block a large portion of the upper portion of through hole 610c, thus substantially reducing the potential for the escape of cover gas through the top of through hole 610c. Thus, it is clear that a large portion of the cover gas that exits through hole 610c will be directed downward toward the bond site area, thus providing further protection from oxidation during the wire bonding operation.

FIGS. 7A-7E illustrates another gas delivery mechanism 710 (and corresponding portions of a wire bonding machine) that operates very similar to the mechanism 610 shown in FIGS. 6A-6D. More specifically, the wire bonding machine includes device clamp 702, transducer 704, bonding tool 706, electrode 718 (including a tip portion extending through aperture 718a), and gas delivery mechanism 710. Gas delivery mechanism 710 defines through hole 710c (i.e., free air ball formation area 710c) which is configured to receive bonding tool 706 during a wire bonding operation. A cover gas is provided via gas inlet 714, and the cover gas travels through cavity/path 722 and exits at gas outlet 722a into through hole 710c to provide cover gas to protect against oxidation during free air ball formation. As described above with respect to FIGS. 6A-6D, because through hole 710 is tapered (and because of the partial blockage of the top portion of through hole 710c by bonding tool 706) more cover gas would tend to exit through hole 710c at the bottom than at the top, thereby providing cover gas directed toward the bond site area.

FIGS. 7A-7E also illustrate an additional gas inlet 716 which provides a cover gas through cavity/path 724, exiting gas delivery mechanism 710 at gas outlet 724a. Gas outlet 724a is provided on a bottom surface of gas delivery mechanism 710 such that the exiting cover gas is directed toward a bond site area of the wire bonding machine. Thus, in contrast to the exemplary embodiment of the present invention shown in FIGS. 6A-6D (where the cover gas provided to the bond site area was the same cover gas provided to free air ball formation area 610c, which exited area 610c through a bottom portion of area 610c), gas delivery mechanism 710 also includes an additional source of cover gas to the bond site area via gas inlet 716, cavity/path 724, and gas outlet 724a. Thus, additional protection (in addition to the protection provided by the gas extending downward out of the free air ball formation area) against potential oxidation at the bond site area is provided.

The various exemplary gas delivery mechanisms disclosed herein may be supported by various structures of a wire bonding machine, for example, the bond head of a wire bonding machine. For example, the gas delivery mechanisms may be supported by the EFO structure, amongst others.

The various exemplary gas delivery mechanisms disclosed herein may be formed from a number of different materials. While metals (e.g., stainless steel) are contemplated, because of the close proximity of the gas delivery mechanism to the sparking from the EFO electrode, it may be desirable to form the body of the gas delivery mechanism from an insulative, and perhaps heat resistant, material such as ceramic, polyimide, amongst others.

The flow of cover gas from a gas supply source (e.g., via a gas supply tube/pipe or the like) may be a continuous flow of cover gas during the entire wire bonding operation. Alternatively, the flow may be a controlled flow (e.g., controlled using a controller integrated with the wire bonding machine) that is provided, for example, during periods of greatest concern regarding potential oxidation (e.g., during free air ball formation, etc.).

The drawings provided herein illustrate exemplary structures for directing a cover gas to (1) the vicinity of the electronic flame off operation of a wire bonding machine, and (2) the vicinity of the bond site area of a wire bonding machine; however, the invention is not limited to the illustrated configurations. The present invention contemplates any type of structure, system or process for providing cover gas to both (1) the vicinity of the electronic flame off operation of a wire bonding machine, and (2) the vicinity of the bond site area of a wire bonding machine. Further, the gas delivery mechanism can include any number of gas inlets (e.g., inlet gas pipes) to provide the desired gas flow and distribution to the free air ball formation area and the bond site area.

When the present invention is used in connection with a wire formed of a reactive metal (e.g., copper, aluminum, etc.) the cover gas is desirably non-reactive with the metal and may be reducing. For example, the cover gas may be an effectively inert gas such as nitrogen or argon. A reducing gas (e.g., hydrogen) may be added to react with any oxygen that may be present; however, the cover gas system of the present invention may be utilized to exclude air from the bond site area without the need for hydrogen in the cover gas. This is a further advantage of the present invention because of the difficulties of using large quantities of highly flammable hydrogen.

The teachings of the present invention may also be utilized in connection with non-reactive bonding wire, such as gold wire. For example, the cover gas may be utilized to provide a shield of clean gas at the bond site area, thereby providing a desirable environment for formation of gold wire loops.

Although the present invention has been described primarily with respect to cover gases such as nitrogen and argon (with or without a forming gas such as hydrogen), it is not limited thereto. Any gas may be utilized so long as it does not react undesirably with the metal used as a bonding wire.

It is understood that the present invention may be applicable to a wire bonding machine that forms wire loops, a wire bonding machine that forms conductive bumps (a bumping machine or a wafer bumping machine), a machine that forms both wire loops and conductive bumps, etc.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A wire bonding machine comprising:
a bonding tool;
an electrode for forming a free air ball on an end of a wire extending through the bonding tool, the free air ball being formed at a free air ball formation area of the wire bonding machine;
a bond site area for holding a semiconductor device during a wire bonding operation; and
a gas delivery mechanism configured to provide a cover gas to: (1) the bond site area whereby the cover gas is ejected through at least one aperture of the gas delivery mechanism to the bond site area, and (2) the free air ball formation area,
wherein the gas delivery mechanism defines a through hole from a top surface of the gas delivery mechanism to a bottom surface of the gas delivery mechanism, the through hole being configured to receive the bonding tool during the wire bonding operation, wherein the through hole defined by the gas delivery mechanism includes the free air ball formation area, wherein the through hole is continuously tapered along its entire length, and wherein a diameter of the tapered through hole at the bottom surface is larger than a diameter of the tapered through hole at the top surface.

2. The wire bonding machine of claim 1 wherein the gas delivery mechanism includes a first gas inlet, the first gas inlet providing the cover gas to the free air ball formation area, whereby at least a portion of the cover gas provided by the first gas inlet exits the free air ball formation area and is directed toward the bond site area.

3. The wire bonding machine of claim 2 wherein the gas delivery mechanism includes a second gas inlet, the second gas inlet providing cover gas to a cavity defined by the gas delivery mechanism, the cavity being distinct from the free air ball formation area, whereby at least a portion of the cover gas provided by the second gas inlet exits the cavity and is directed toward the bond site area.

4. The wire bonding machine of claim 1 wherein the at least one aperture of the gas delivery mechanism includes a plurality of apertures through which the cover gas is ejected toward the bond site area.

5. The wire bonding machine of claim 4 wherein the plurality of apertures are defined by the bottom surface of the gas delivery mechanism.

6. The wire bonding machine of claim 1 wherein the gas delivery mechanism defines (1) a first cavity for receiving the cover gas from at least one gas inlet and for providing the cover gas to the bond site area through the at least one aperture, and (2) a second cavity for receiving the cover gas from the at least one gas inlet and for providing the cover gas to the free air ball formation area.

7. The wire bonding machine of claim 6 wherein the at least one gas inlet includes a first gas inlet for providing the cover gas to the first cavity, and a second gas inlet for providing the cover gas to the second cavity.

8. The wire bonding machine of claim 1 further comprising a device clamp for securing the semiconductor device during the wire bonding operation, the device clamp defining a device aperture through which the bonding tool can access the semiconductor device to perform the wire bonding operation at the bond site area, the wire bonding machine further comprising a cover for covering at least a portion of the device aperture during the wire bonding operation.

9. The wire bonding machine of claim 1 wherein the electrode extends through a portion of the gas delivery mechanism such that a tip of the electrode is positioned at the free air ball formation area.

10. The wire bonding machine of claim 9 further comprising an insulator surrounding a portion of the tip of the electrode adjacent the free air ball formation area.

11. The wire bonding machine of claim 1 wherein the gas delivery mechanism includes a gas inlet for receiving the cover gas from a gas supply, and wherein the electrode extends through the gas inlet.

12. The wire bonding machine of claim 1 wherein the gas delivery mechanism defines a side opening such that sidewalls of the gas delivery mechanism do not entirely surround the bonding tool during the wire bonding operation.

13. The wire bonding machine of claim 1 wherein the gas delivery mechanism includes a funnel shaped body portion defining (1) a first opening at a top of the funnel shaped body portion to receive the bonding tool, and (2) a second opening at a bottom of the funnel shaped body portion for ejection of the cover gas toward the bond site area.

14. The wire bonding machine of claim 13 wherein the first opening has a smaller diameter than a diameter of the second opening.

15. A wire bonding machine comprising:
a bonding tool;
an electrode for forming a free air ball on an end of a wire extending through the bonding tool, the free air ball being formed at a free air ball formation area of the wire bonding machine;
a bond site area for holding a semiconductor device during a wire bonding operation;
and a gas delivery mechanism configured to provide a cover gas to: (1) the bond site area whereby the cover gas is ejected through at least one aperture of the gas delivery mechanism to the bond site area, and (2) the free air ball formation area, wherein the gas delivery mechanism includes a first gas inlet for receiving the cover gas from a gas supply and for providing the cover gas to the bond site area and the free air ball formation area, and wherein the gas delivery mechanism also includes a second gas inlet for providing the cover gas directly to the bond site area through an outlet provided on a bottom surface of the gas delivery mechanism, the outlet being distinct from the at least one aperture.

16. The wire bonding machine of claim 15 further comprising a device clamp for securing the semiconductor device during the wire bonding operation, the device clamp defining a device aperture through which the bonding tool can access the semiconductor device to perform the wire bonding operation at the bond site area, the wire bonding machine further comprising a cover for covering at least a portion of the device aperture during the wire bonding operation.

17. The wire bonding machine of claim 15 wherein the gas delivery mechanism defines a through hole from a top surface of the gas delivery mechanism to the bottom surface of the gas delivery mechanism, the through hole being configured to receive the bonding tool during a wire bonding operation, wherein the through hole defined by the gas delivery mechanism includes the free air ball formation area, wherein the through hole is tapered.

18. A wire bonding machine comprising:
a bonding tool;
an electrode for forming a free air ball on an end of a wire extending through the bonding tool, the free air ball being formed at a free air ball formation area of the wire bonding machine;
a bond site area for holding a semiconductor device during a wire bonding operation; and
a gas delivery mechanism including a body portion defining a through hole extending from a top surface of the body portion to a bottom surface of the body portion, the body portion being configured to receive an electrode, the body portion defining an aperture on a sidewall of the through hole configured to receive a tip portion of the electrode, the gas delivery mechanism defining a cavity for receiving a cover gas from a gas inlet, the cavity including a gas outlet at the through hole, wherein a portion of the cavity adjacent the gas outlet follows a curved path inside the gas delivery mechanism,
the through hole being continuously tapered along its entire length such that a diameter of the tapered through hole at the bottom surface is larger than a diameter of the tapered through hole at the top surface.

19. The wire bonding machine of claim 18 further comprising a device clamp for securing the semiconductor device during the wire bonding operation, the device clamp defining a device aperture through which the bonding tool can access the semiconductor device to perform the wire bonding operation at the bond site area, the wire bonding machine further comprising a cover for covering at least a portion of the device aperture during the wire bonding operation.

* * * * *